United States Patent
Kweon et al.

[11] Patent Number: 5,951,804
[45] Date of Patent: Sep. 14, 1999

[54] METHOD FOR SIMULTANEOUSLY MANUFACTURING CHIP-SCALE PACKAGE USING LEAD FRAME STRIP WITH A PLURALITY OF LEAD FRAMES

[75] Inventors: Young Do Kweon, Seoul; Kwang Soo Kim, Suwan, both of Rep. of Korea

[73] Assignee: Samsung Electronics Co., Ltd., Suwan, Rep. of Korea

[21] Appl. No.: 08/885,795

[22] Filed: Jun. 30, 1997

[30] Foreign Application Priority Data

Jul. 15, 1996 [KR] Rep. of Korea ............... 96-28597

[51] Int. Cl.⁶ ................................................. H05K 3/30
[52] U.S. Cl. ...................... 156/244.12; 156/300; 29/856; 29/881; 264/272.17
[58] Field of Search .................. 174/254; 29/854, 29/855, 856, 884; 264/272.14, 272.17; 156/297, 299, 300, 302, 244.12; 257/781, 735, 736

[56] References Cited

U.S. PATENT DOCUMENTS

| | | | |
|---|---|---|---|
| 2,758,256 | 8/1956 | Eisler | 361/777 |
| 3,160,790 | 12/1964 | Mittler | 361/774 |
| 3,226,802 | 1/1966 | Goodwin, Jr. et al. | 29/847 |
| 3,342,927 | 9/1967 | Kubik et al. | 174/267 |
| 3,537,175 | 11/1970 | St. Clair et al. | 29/827 |
| 3,568,129 | 3/1971 | Gold | 439/70 |
| 3,614,832 | 10/1971 | Chance et al. | 29/831 |
| 4,892,245 | 1/1990 | Dunaway et al. | 228/180.22 |
| 5,357,400 | 10/1994 | Takekawa | 361/704 |
| 5,440,452 | 8/1995 | Kitahara | 361/773 |

Primary Examiner—Francis J. Lorin
Attorney, Agent, or Firm—Jones Volentine, L.L.P

[57] ABSTRACT

A method for simultaneously manufacturing chip-scale packages employing a lead frame strip having a plurality of lead frames. The method includes the steps of forming the lead frame strip and the plurality of TAB tapes, and then simultaneously bonding bottom surfaces of parallel leads and tie bars of each of the respective lead frames to a top surface of the TAB tape. A plurality of chips are attached to the top surface of the TAB tape and the chips are electrically connected to contact leads formed on the TAB tape. The chips and electrical connections are then encapsulated with a molding resin to form individual packages. The individual packages are then separated from the lead frame strip.

10 Claims, 16 Drawing Sheets

METHOD FOR SIMULTANEOUSLY MANUFACTURING CHIP-SCALE PACKAGE USING LEAD FRAME STRIP WITH A PLURALITY OF LEAD FRAMES

BACKGROUND OF THE INVENTION

1. Field of the Invention

The present invention relates to a method for manufacturing a chip-scale package, and more particularly, to a method for manufacturing a chip-scale package ("CSP") using a lead frame strip having a plurality of lead frames, for facilitating mass production of CSPs.

2. Description of the Related Art

The continued trend toward miniaturization of electronic and electrical systems requires a reduction in the overall size of the semiconductor device packages that are employed therein. Packages having good reliability, multi-function capability, as well as a small size are thus required.

A so-called CSP ("chip scale package" or "chip size package") can satisfy the miniaturization and multi-function requirements, since it is as small as a bare chip and can be mounted using surface mount technologies.

However, the CSP suffers some drawbacks in that sophisticated and expensive production equipment is required. Also, the CSP is produced in individual units, rather than in strip form. Both of these drawbacks greatly increase the production cost of the device.

FIG. 1 is a schematic cross-sectional view of a conventional chip-scale package manufactured by Tessera Corp. The CSP 100 has bonding pads 12 on the bottom surface of the chip 10 that are electrically connected to respective ones of the corresponding flexible patterns 20. Insulating polyimide film 40 is bonded to the bottom surface of flexible patterns 20. The polyimide film 40 has via holes coated with a conductive material on their inner wall, through which the flexible patterns 20 are electrically connected to solder bumps 60. An elastomer 30 is interposed between the flexible patterns 20 and the parts of the bottom surface of the chip 10 where no bonding pads are formed. The chip 10 is immobilized by a handling ring 50.

This type of package is basically a micro-BGA (ball grid array) package using a flip chip interconnection technology. This structure is advantageous in that it can be subjected to various tests such as burn-in tests, as well as allowing for high density mounting and efficient heat dissipation. However, this type of package is expensive to produce and also requires a production line that is set up to perform many independent processes, which is not conducive to mass production.

FIG. 2 is a cut-away perspective view of another example of conventional chip-scale package developed by Mitsubishi Corp. The CSP 200 has bonding pads 112 formed on the central part of the upper surface of chip 110 that are electrically connected to respective ones of the corresponding solder bumps 160 via circuit patterns 120 on the upper surface of the chip 110. The chip 110, circuit patterns 120 and electrical interconnections 112 are encapsulated with a molding compound 150 to provide protection from the external environment. The solder bumps 160 are exposed through the surface of the molding compound 150.

In addition to the advantages of the CSP device shown in FIG. 1, the device in FIG. 2 has the additional advantage of flexibility in that the bonding pads can be located at many positions. However, one drawback is that the relatively large size of the solder bumps make it difficult to satisfy high pin device requirements. Also, the manufacturing process is complex and expensive since the circuit patterns are formed during the wafer fabricating process. Furthermore, the devices must be produced individually, rather than achieving the economies of mass production.

SUMMARY OF THE INVENTION

The present invention provides a process for manufacturing CSPs by using lead frame strips having a plurality of lead frame units to enable existing production equipment to be utilized, thereby making it possible to increase the mass producability of the CSPs devices.

To achieve these and other advantages, the present invention provides for a process of manufacturing chip-scale packages, comprising the steps of: forming the lead frame strip and the plurality of TAB tapes; bonding a bottom surface of the parallel leads of the lead frames and a bottom surface of the tie bars to a top surface of the TAB tape; attaching a plurality of chips to a top surface of adhesive tapes on the top surface of the TAB tapes in the respective central spaces of each lead frame, and electrically connecting the chips to the contact leads; encapsulating parts comprising the elongated slots, the chips and electrical connections with a molding resin to form individual packages; and separating the individual packages from the lead frame strip.

BRIEF DESCRIPTION OF THE DRAWINGS

These and various other features and advantages of the present invention will be described with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 1:
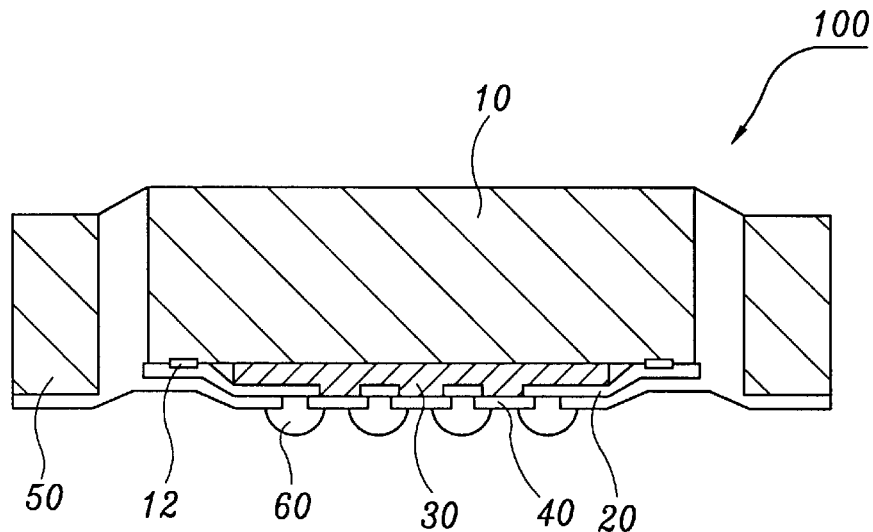
FIG. 1 is a schematic cross-sectional view of an example of conventional chip-scale package manufactured by Tessera.
Figure 2:
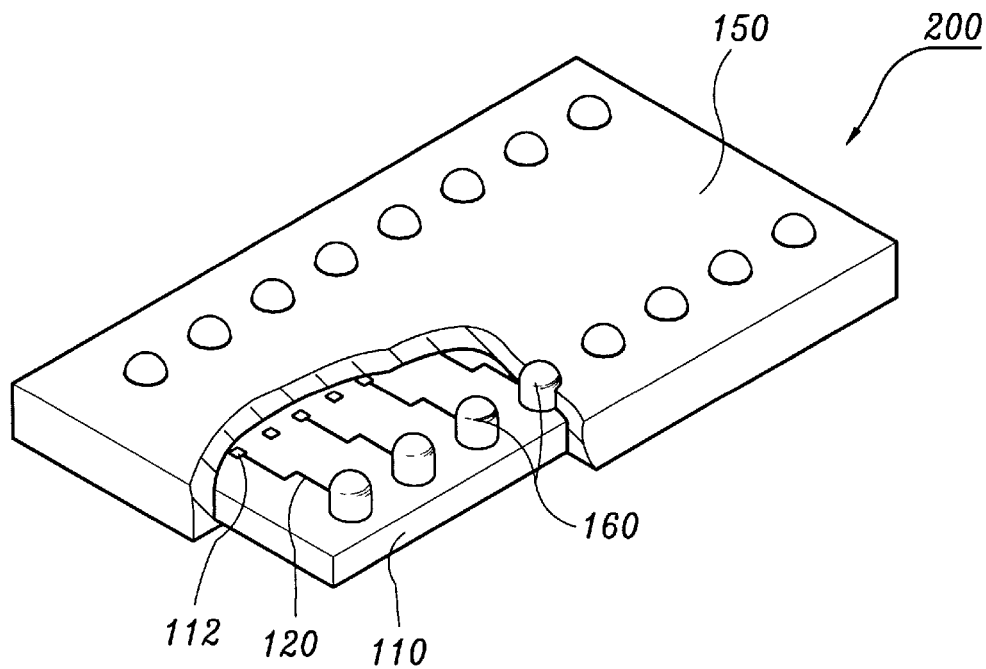
FIG. 2 is a cut-away perspective view of another example of conventional chip-scale package manufactured by Mitsubishi.
Figure 3:
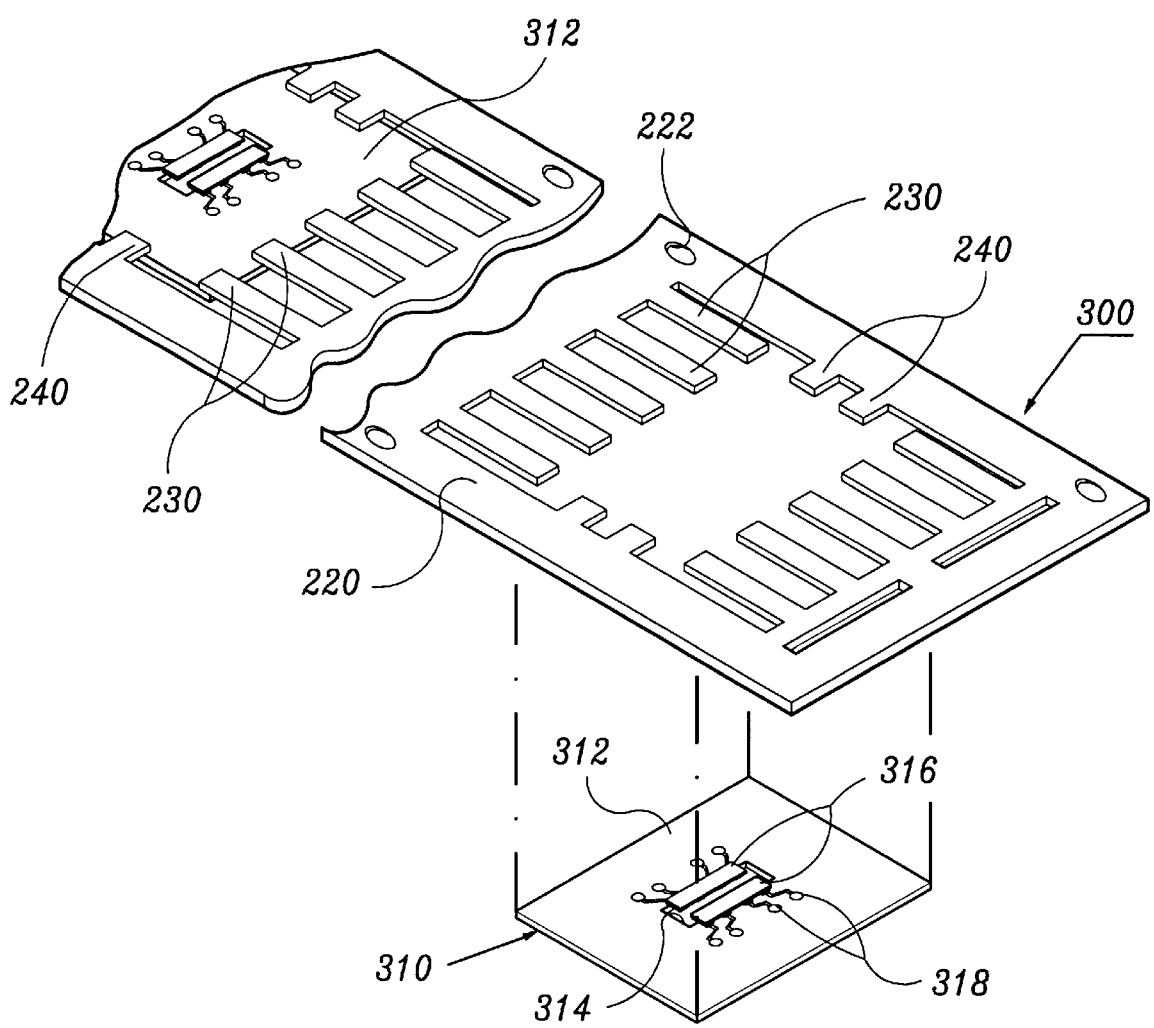
FIG. 3 is an exploded perspective view of a lead frame strip with a plurality of TAB tapes according to one embodiment of the present invention.
Figure 4:
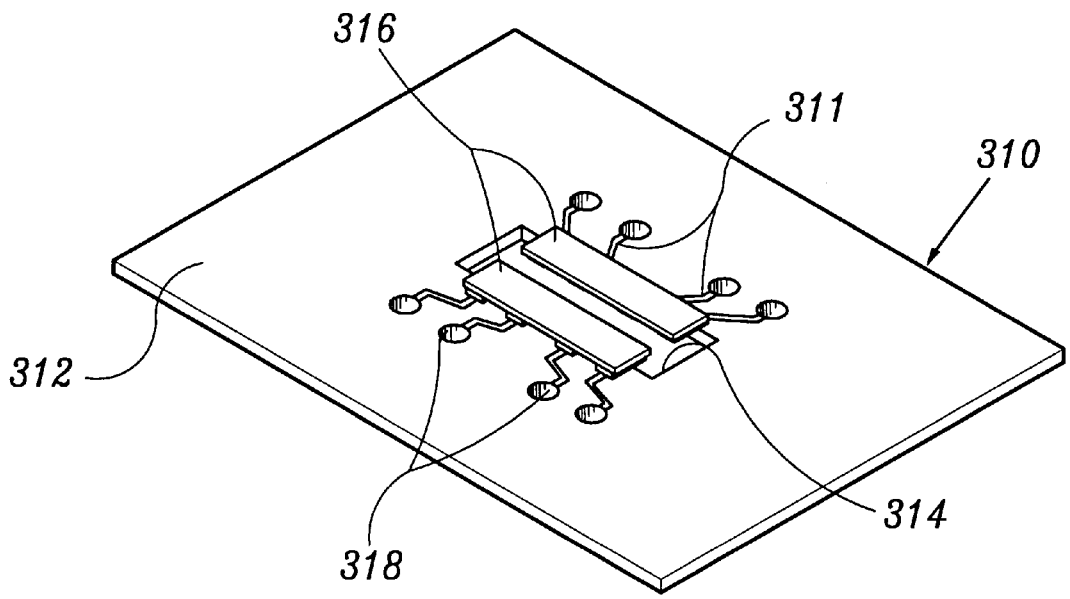
FIG. 4 is an enlarged perspective view of the top of the TAB tape in FIG. 3.
Figure 5:
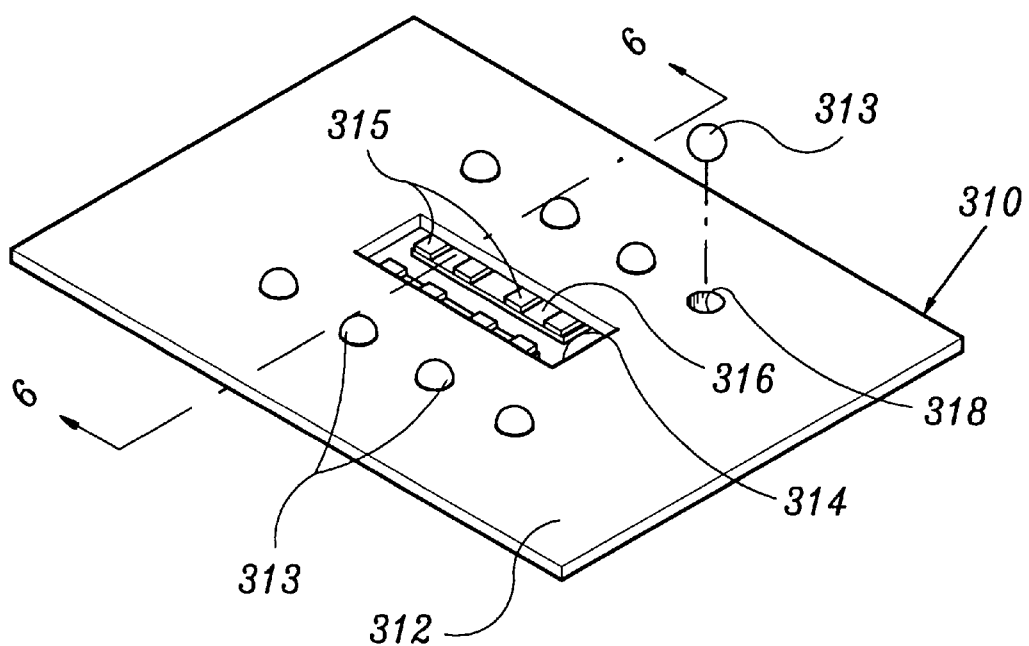
FIG. 5 is an enlarged perspective view of the bottom of the TAB tape of FIG. 3.
Figure 6:
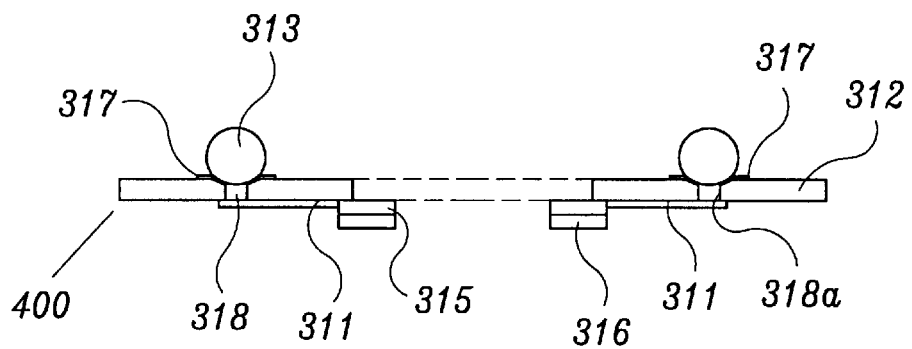
FIG. 6 is a sectional view of the lead frame bonded with TAB tape, taken along the line 6—6 in FIG. 5.

FIG. 3 is a perspective view depicting a lead frame strip with a plurality of TAB (Tape Automated Bonding) tapes according to one embodiment of the present invention; FIG. 4 is an enlarged perspective view of the top of the TAB tape in FIG. 3; FIG. 5 is a perspective view of the bottom of the TAB tape in FIG. 3; and FIG. 6 is a sectional view of the lead frame having a TAB tape bonded thereto, taken along the line 6—6 in FIG. 5. With reference to FIGS. 3 through 6, patterned TAB tapes 310 are attached to lead frame strip 300 having a plurality of LOC (Lead-on-Chip) lead frames 250. TAB tapes 310 are bonded to a bottom surface of spaced parallel leads 230 and a bottom surface of tie bars 240 of each of the respective corresponding lead frames 250. The lead frame strip 300 comprises a pair of parallel side rails 220 having a plurality of indexing holes 222 spaced at a designated distance, with the plurality of lead frames 250 formed between and along the side rails 220.

The indexing holes 222 of the side rails 220 mate with pins of a lead frame transferring rail of the semiconductor device package assembly system for indexing and moving the lead frame strip 300. As shown in FIG. 3, the LOC type lead frame 250 has two opposing rows of a plurality of, for example, five leads 230. The TAB tape 310 will be disposed in the space S defined between the rows of the leads 230.

TAB tape 310 is comprised of a polyimide base tape 312 having an adhesive at both its upper and lower surfaces and an elongated slot 314 formed in a central portion therein. A plurality of contact leads 315 (see FIG. 5), for example four, are formed in a pair of opposing rows on the upper surface of the base tape 312. Each of the contact leads 315 has one end extending toward the center of the elongated slot 314. Each row of contact leads 315 are bonded to a double-sided adhesive, for example, polyimide tape 316 as shown in FIG. 4.

On the base tape 312, a plurality of via holes 318 are formed in two rows, outwardly of the rows of contact leads 315. The number of via holes 318 equals that of the contact leads 315. The via holes 318 may be formed by punching or etching so as to have a inner diameter of 3 to 10 mil (0.008 to 0.03 mm). Inner walls of the via holes 318 are covered with a conductive coating 318a made from, for example, gold or solder. The coating 318a may be formed using a non-electrolytic plating method. External connection terminals 313, for example, solder balls, are mounted on and electrically connected to the via holes 318.

The via holes 318 may be are tapered so that their upper inner diameter is greater than their lower inner diameter. The reliability of the final package is thus improved by increasing the contact area of the external connection terminal 313 with the via hole 318. Solder paste 317 is applied on the upper surface of the base tape 312 around the via holes 318 for safe and easy mounting of external connection terminals 313 on via holes 318.

As shown in FIGS. 4 and 6, via holes 318 are electrically connected to one end of respective ones of the corresponding contact leads 315 via circuits patterns 311. Accordingly, contact leads 315, circuit patterns 311, via holes 318 and external connection terminals 313 are electrically interconnected.

TAB tapes 310 are bonded to respective ones of the corresponding lead frames 250 in the lead frame strip 300 as follows: a plurality of TAB tapes 310 are aligned below the lead frame strip 300 so that each TAB tape 310 can be fitted to a corresponding lead frame 250. Multiple bondings between the plurality of TAB tapes 310 and the respective corresponding plurality of lead frames 250 are simultaneously carried out by either lifting the TAB tapes 310 or lowering the lead frame strip 300 by using a lifting apparatus (not shown).

Figure 7:
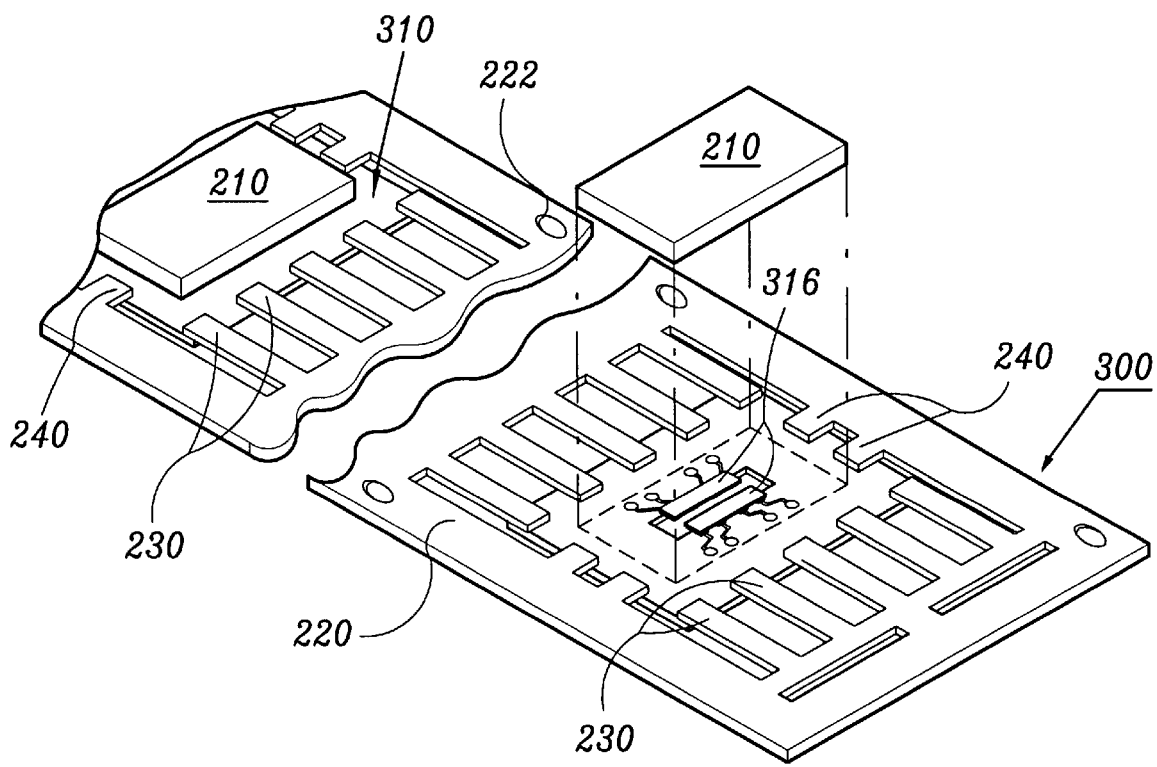
FIG. 7 is an exploded top perspective view of an attachment of a chip to the TAB tape.
Figure 8A:
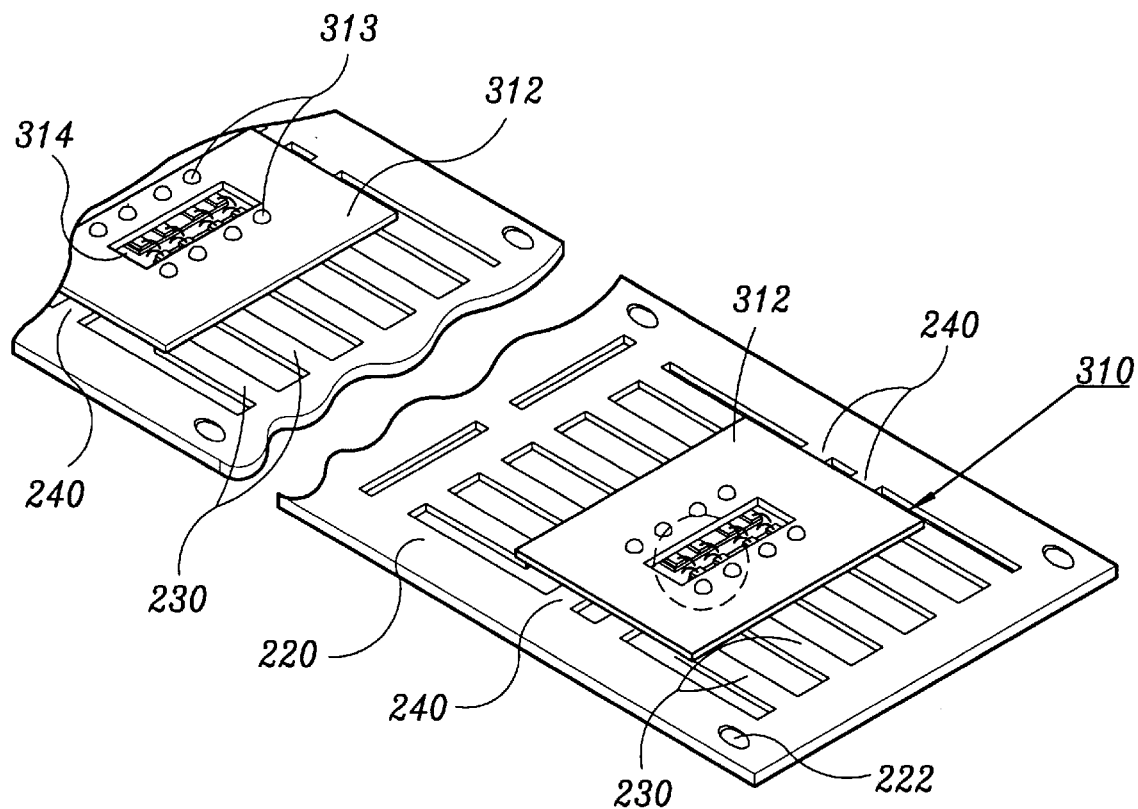
FIG. 8A is a detailed bottom perspective view of an electrical connection of the chip to the TAB tape.
Figure 8B:
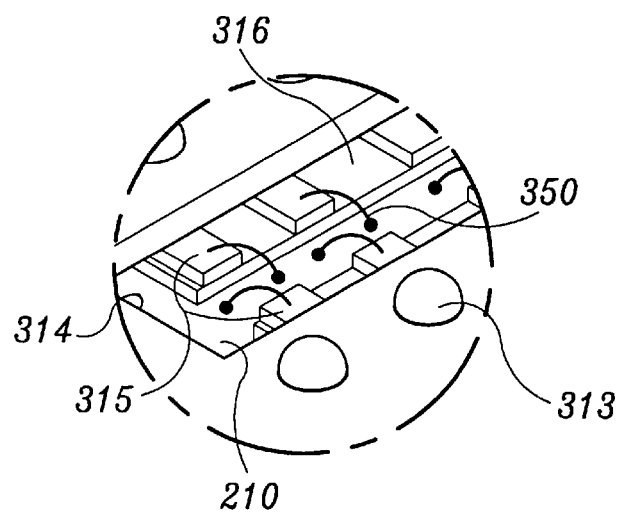
FIG. 8B is an enlargement of an area of the TAB tape shown in FIG. 8A.

FIG. 7 is a perspective view of an attachment of a chip 210 to the TAB tape 310 and FIGS. 8A and 8B are detailed perspective views of the electrical connections of the chip 210 to the TAB tape 310. With reference to FIGS. 7, 8A, and 8B, the active surface of the chips 210 is attached to respective pairs of corresponding polyimide tapes 316 of the TAB 310. Then, bonding pads 348 formed on the central part of the active surface of the chip 210 are electrically connected to respective corresponding contact leads 315 of the TAB tape 310 via bonding wires 350. The wire electrical connections are attached through the elongated slot 314 of the base tapes 312.

Figure 9:
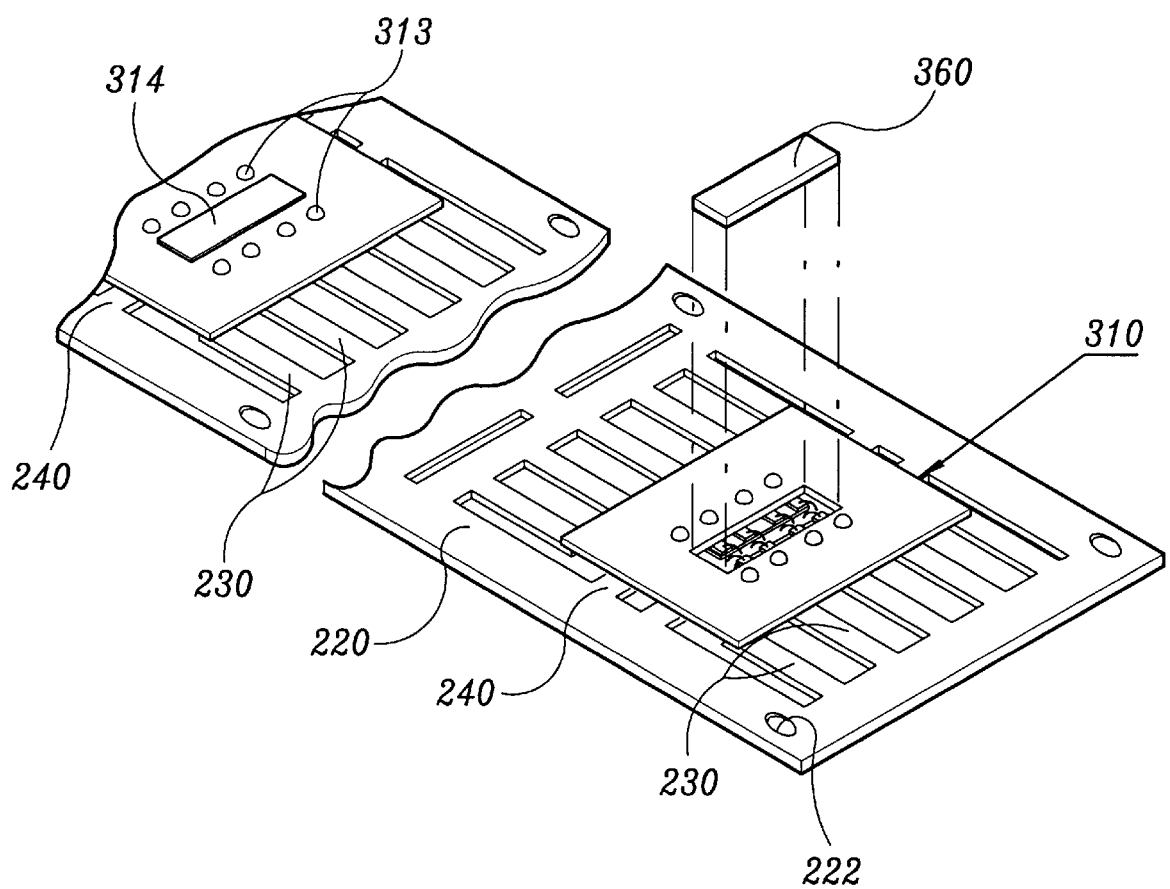
FIG. 9 is a perspective view of the bottom of the structure in FIG. 8A, illustrating an underfilling of the electrical connections.
Figure 10:
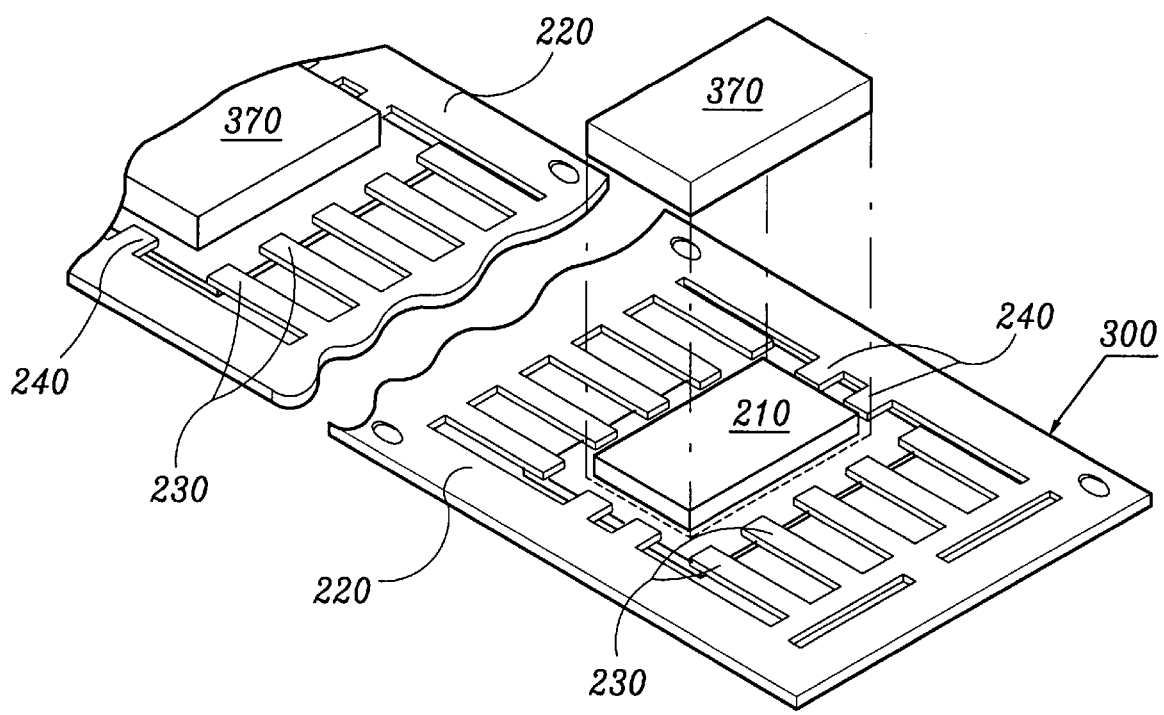
FIG. 10 is a perspective view of the encapsulated package in FIG. 9.

FIG. 9 is a perspective view of the bottom of of the device of FIG. 8A, showing the underfilling of the electrical connections in FIG. 8A, and FIG. 10 is a perspective view depicting an encapsulated package of FIG. 9. With reference to FIGS. 9 and 10, the electrical connections are encapsulated by filling the elongated slot 314 with a liquid resin 360. Further, the top surface of base tapes 312 and chips 210 are encapsulated with epoxy molding resin to produce individual chip packages 370. The order of liquid resin and epoxy molding encapsulation steps may be exchanged, or both steps may be carried out simultaneously.

Figure 11:
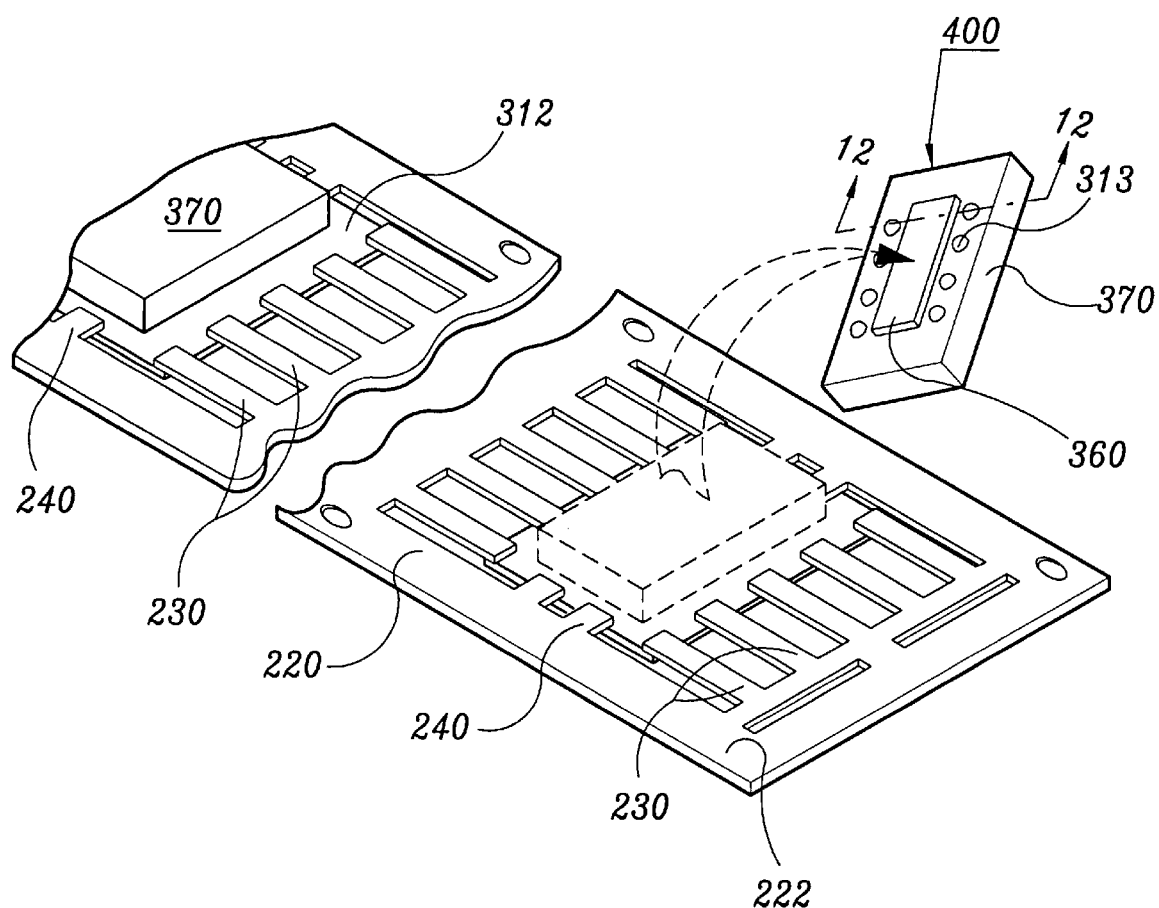
FIG. 11 is a perspective view illustrating the separation of an individual chip from the lead frame strip.
Figure 12:
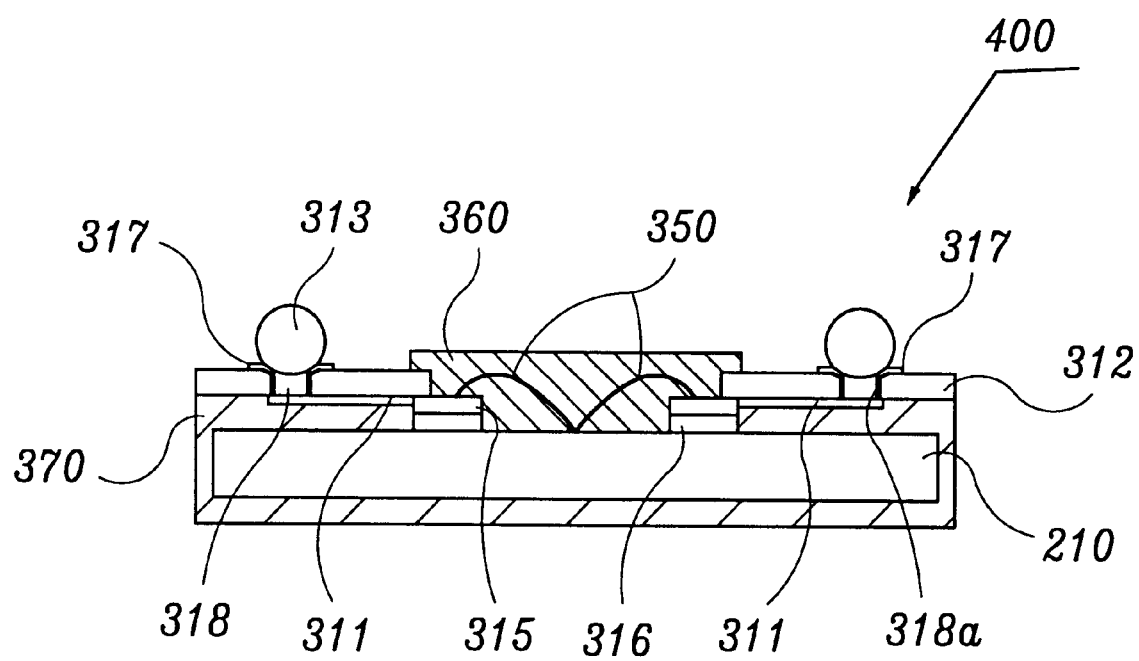
FIG. 12 is a sectional view of the individual chip, taken along the line 12—12 in FIG. 11.

FIG. 11 is a perspective view illustrating the separation of an individual package chip 400 from the lead frame strip 300 and FIG. 12 is a sectional view of the individual chip 400, taken along the line 12—12 in FIG. 11. The individual packages 400 are separated from the lead frame strip 300 by cutting the base tapes 312, that are joined to lead frame strip 300, around the area forming package body 370, using a cutting means such as a punch to produce the individual packages 400. The individual packages 400 are then subjected to various reliability tests prior to shipment A cross section of the CSP 400 according to the present invention is shown in FIG. 12. In the orientation shown, the active surface of chip 210 is bonded to the lower surface of adhesive polyimide tapes 316. Bonding pads 348 formed on the central part of chip 210 are electrically connected to respective of corresponding contact leads 315 via wires 350. The contact leads 315 are again electrically connected to respective of corresponding via holes 318 through circuit patterns 311. The via holes 318 are electrically connected to respective of corresponding external connection terminals 313. Solder pastes 317 may be applied on the upper surface of the base tape 312 around the via holes 318 to easily and securely mount connection terminals 313. The inner walls of via holes 318 are covered with a conductive coating material 318a for electrical connections. Note that the bonding pads 348 of chip 210, contact leads 315, circuit patterns 311, via holes 318 and external connection terminals 313 are thus electrically interconnected.

To protect the chip from the external environment a liquid resin 360 is applied to the elongated slot 314 to protect the electrical connections as shown in FIG. 12. The height of molded part 360 should be lower than that of external contact terminal 313. If the height of the molding part 360 is greater than that of external contact terminals 313, mount failures may occur and electrical connections may be damaged by the external pressure on the molding part 360 when the package 400 is mounted on electrical devices such as a printed circuit board. In a final step, the chips and the surface of base tapes 312 are encapsulated with an epoxy resin to produce an individual package.

Figure 13:
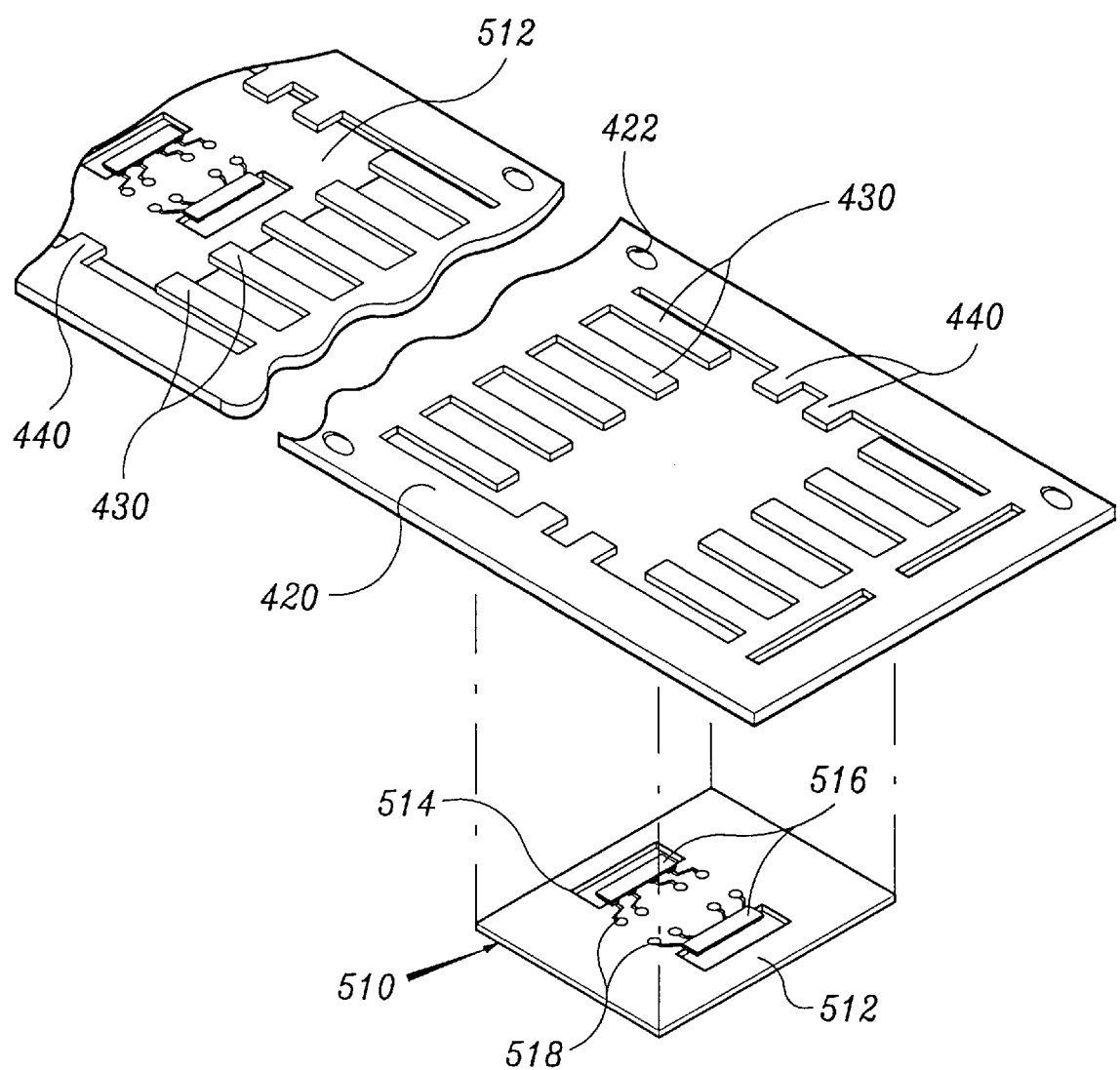
FIG. 13 is an exploded perspective view of a lead frame strip with a plurality of TAB tapes according to another embodiment of the present invention.
Figure 14:
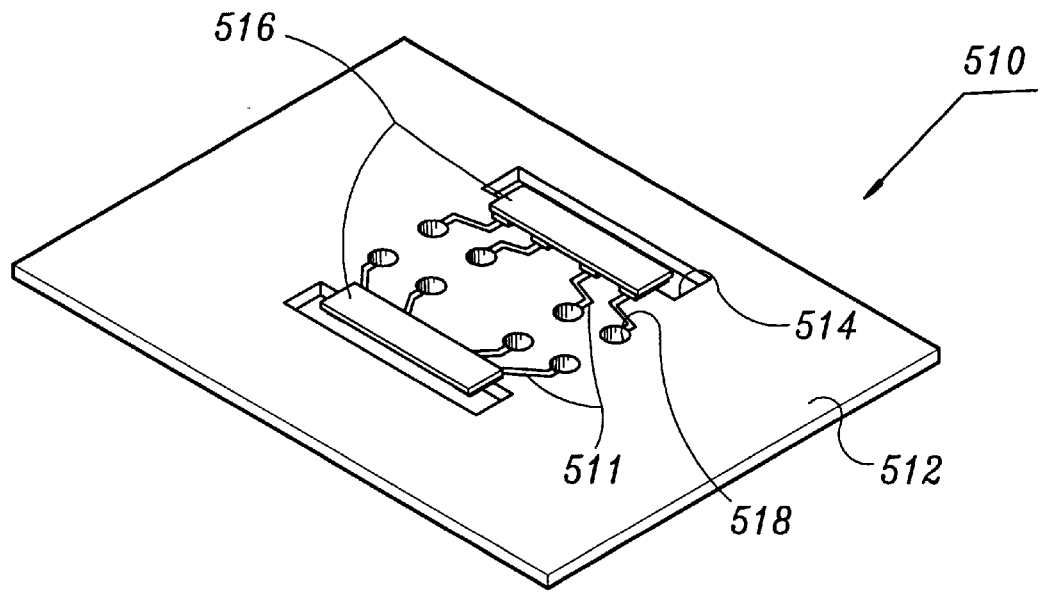
FIG. 14 is an enlarged perspective view of the top of the TAB tape in FIG. 13.
Figure 15:
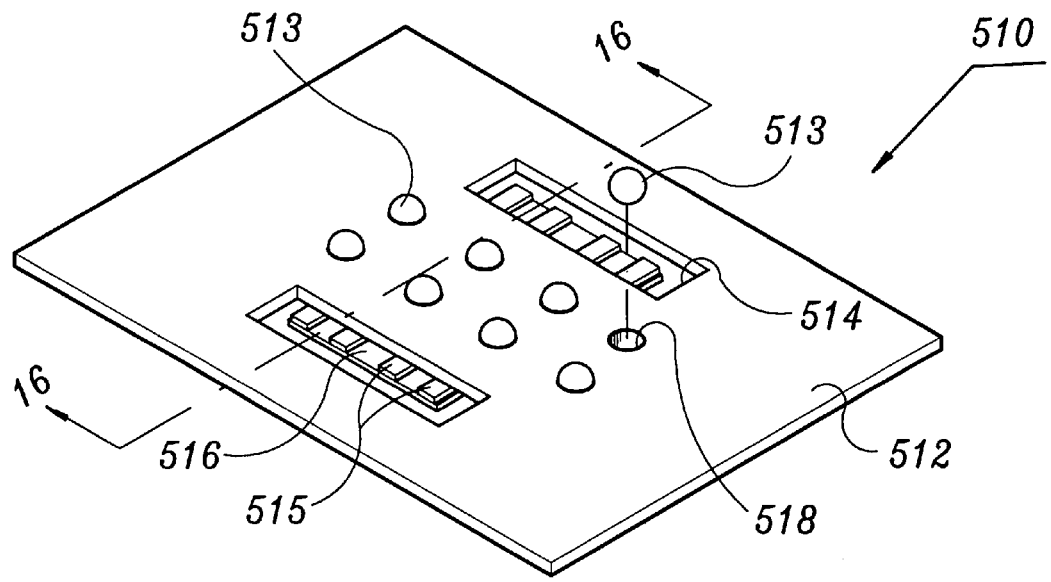
FIG. 15 is an enlarged perspective view of the bottom of the TAB tape in FIG. 13.
Figure 16:
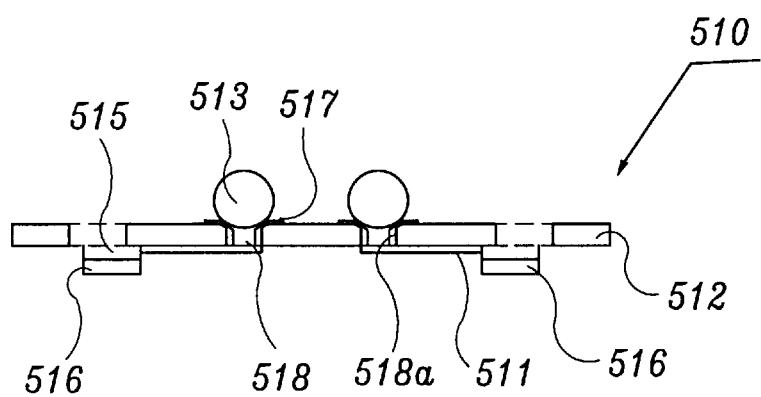
FIG. 16 is a sectional view of the lead frame bonded with TAB tape, taken along the line 16—16 in FIG. 15.

FIG. 13 is a perspective view depicting a lead frame strip with a plurality of TAB tapes according to another embodiment of the present invention; FIG. 14 is an enlarged perspective view of the top of the TAB tape in FIG. 13; FIG. 15 is a perspective view of the bottom of the TAB tape in FIG. 13; and FIG. 16 is a sectional view of the lead frame having a TAB tape bonded thereto, taken along the line 16—16 in FIG. 15. With reference to FIGS. 13 through 16, patterned TAB tapes 510 are attached to lead frame strip 500 having a plurality of LOC (Lead-on-Chip) lead frames 450. TAB tapes 510 are bonded to a bottom surface of spaced parallel leads 430 and a bottom surface of tie bars 440 of each of the respective corresponding lead frames 450. The lead frame strip 500 comprises a pair of parallel side rails 420 having a plurality of indexing holes 422 spaced at a designated distance, with the plurality of lead frames 450 formed between and along the side rails 420.

The indexing holes 422 of the side rails 420 mate with pins of a lead frame transferring rail of the semiconductor device package assembly system for indexing and moving the lead frame strip 500. As shown in FIG. 13, the LOC type lead frame 450 has two opposing rows of a plurality of, for example, five leads 430. The TAB tape 510 will be disposed in the space S' defined between the rows of the leads 430.

TAB tape 510 is comprised of a polyimide base tape 512 having an adhesive at both its upper and lower surfaces. A pair of elongated slots 514 are formed at opposing peripheral sides of base tape 512. A plurality of contact leads 515 (see FIG. 15), for example four, are formed in a pair of opposing rows on the upper surface of the base tape 512. One end of each of the contact leads 515 in each row extends toward the center of the respective adjacent elongated slot 514. Each row of contact leads 515 are bonded to a double-sided adhesive, for example, polyimide tape 516 as shown in FIG. 14.

On the base tape 512, a plurality of via holes 518 are formed in two rows, inwardly of the rows of contact leads 515. The number of via holes 518 equals that of the contact leads 515. The via holes 518 may be formed by punching or etching so as to have a inner diameter of 3 to 10 mil (0.008 to 0.03 mm). Inner walls of the via holes 518 are covered with a conductive coating 518a made from, for example, gold or solder. The coating 518a may be formed using a non-electrolytic plating method. External connection terminals 513, for example, solder balls, are mounted on and electrically connected to the via holes 518.

The via holes 518 may be are tapered so that its upper inner diameter is greater than the lower inner diameter. The reliability of the final package is thus improved by increasing the contact area of the external connection terminal 513 with the via hole 518. Solder paste 517 is applied on the upper surface of the base tape 512 around the via holes 518 for safe and easy mounting of external connection terminals 513 on via holes 518.

As shown in FIGS. 14 and 16, via holes 518 are electrically connected to one end of respective ones of the corresponding contact leads 515 via circuits patterns 511. Accordingly, contact leads 515, circuit patterns 511, via holes 518 and external connection terminals 513 are electrically interconnected.

TAB tapes 510 are bonded to respective of the corresponding lead frames 450 in the lead frame strip 500 as follows: a plurality of TAB tapes 510 are aligned below the lead frame strip 500 so that each TAB tape 510 can be fitted to a corresponding lead frame 450. Multiple bondings between the plurality of TAB tapes 510 and the respective corresponding plurality of lead frames 450 are simultaneously carried out by either lifting the TAB tapes 510 or lowering the lead frame strip 500 by using a lifting apparatus (not shown).

Figure 17:
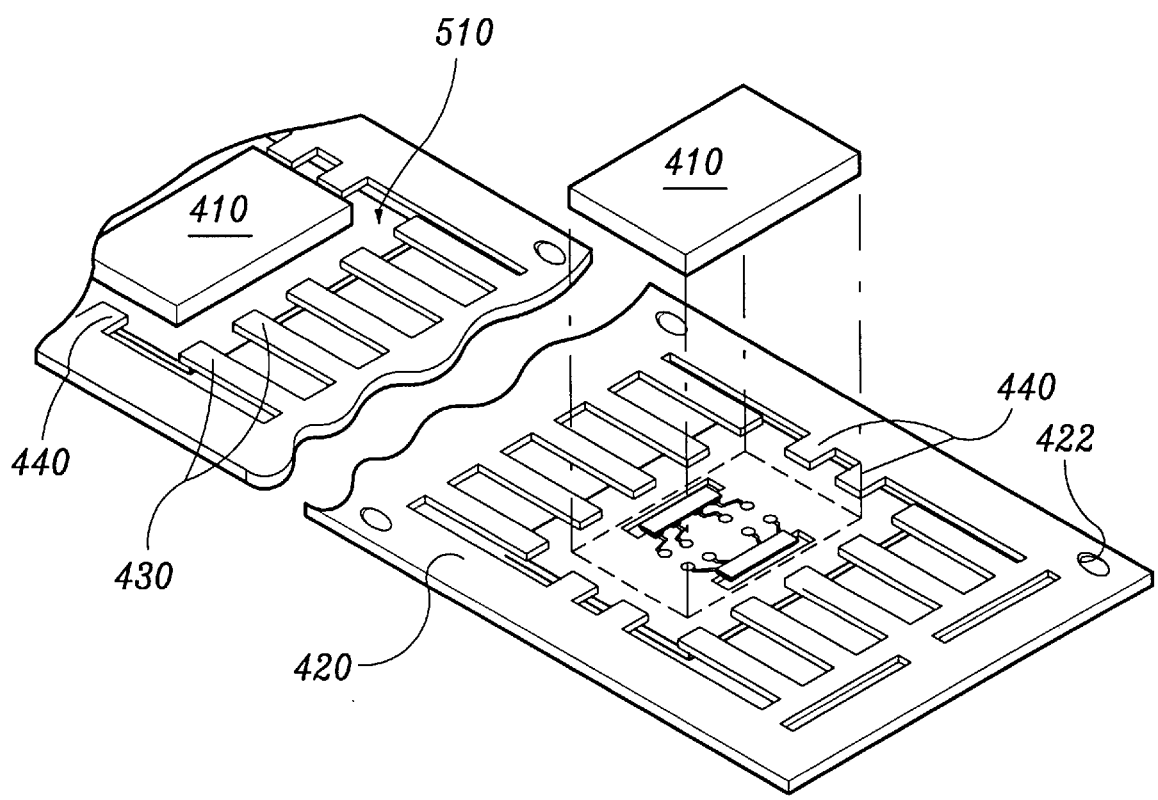
FIG. 17 is an exploded top perspective view illustrating the attaching of a chip to the TAB tape.
Figure 18A:
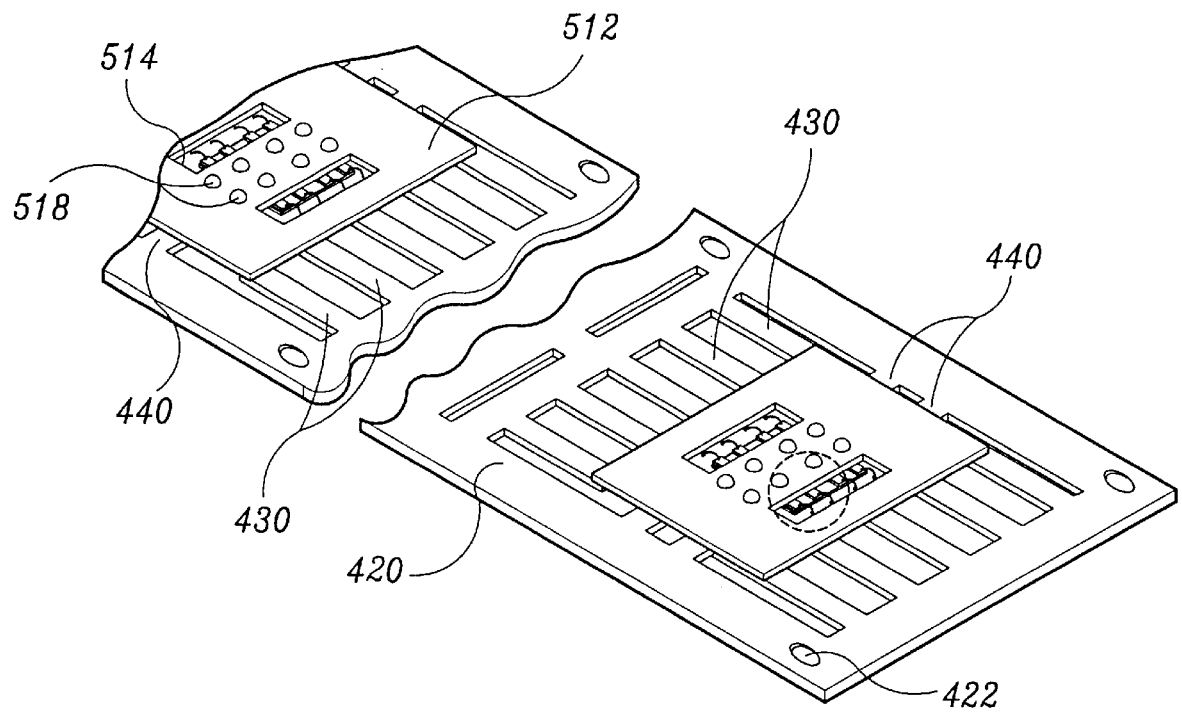
FIG. 18A is a detailed bottom perspective view of an electrical connections of the chip to the TAB tape.
Figure 18B:
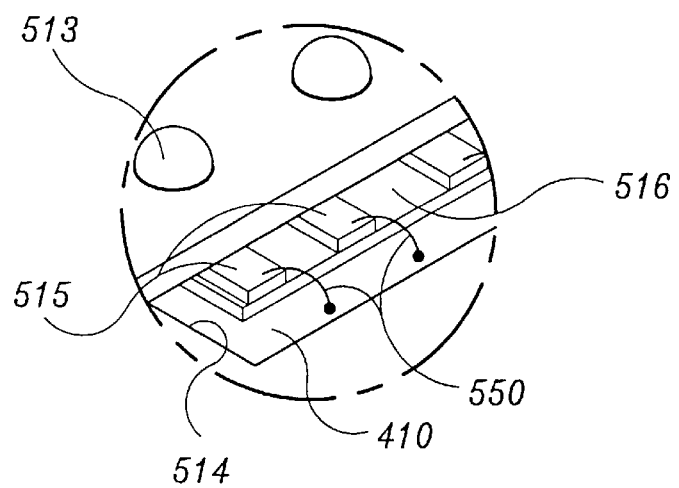
FIG. 18B is an enlargement of an area of the TAB tape shown in FIG. 18A.

FIG. 17 is a perspective view of an attachment of a chip 410 to the TAB tape 510 and FIGS. 18A and 18B are detailed perspective views of the electrical connections of the chip 410 to the TAB tape 510. With reference to FIGS. 17, 18A and 18B, the active surface of the chips 410 is attached to respective pairs of corresponding polyimide tapes 516 of the TAB 510. Then, bonding pads 448 formed on each side of the active surface of the chip 410 are electrically connected to respective corresponding contact leads 515 of the TAB tape 510 via bonding wires 550. The wire electrical connections are attached through the elongated slots 514 of the base tapes 512.

Figure 19:
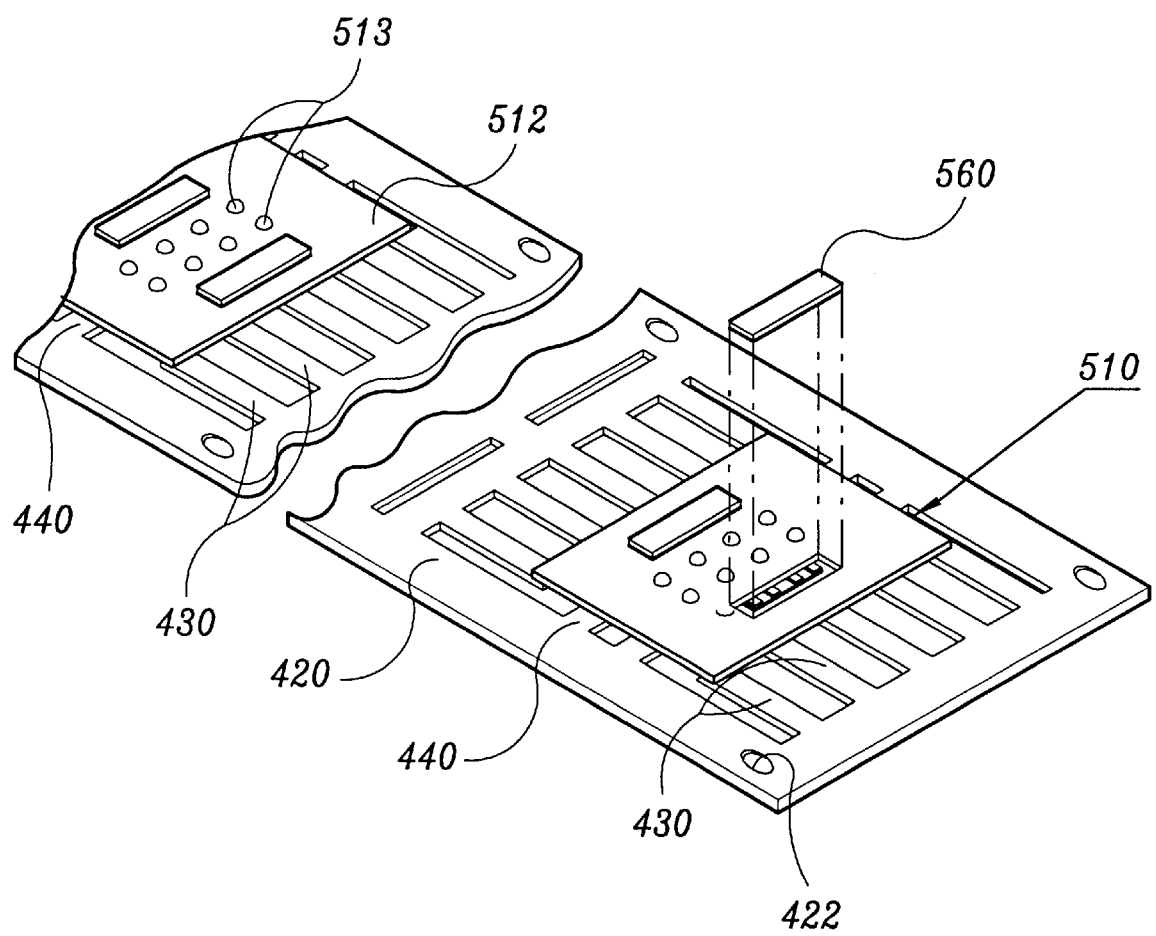
FIG. 19 is a perspective view of the bottom of the structure of FIG. 18A showing an underfilling of the electrical connections.
Figure 20:
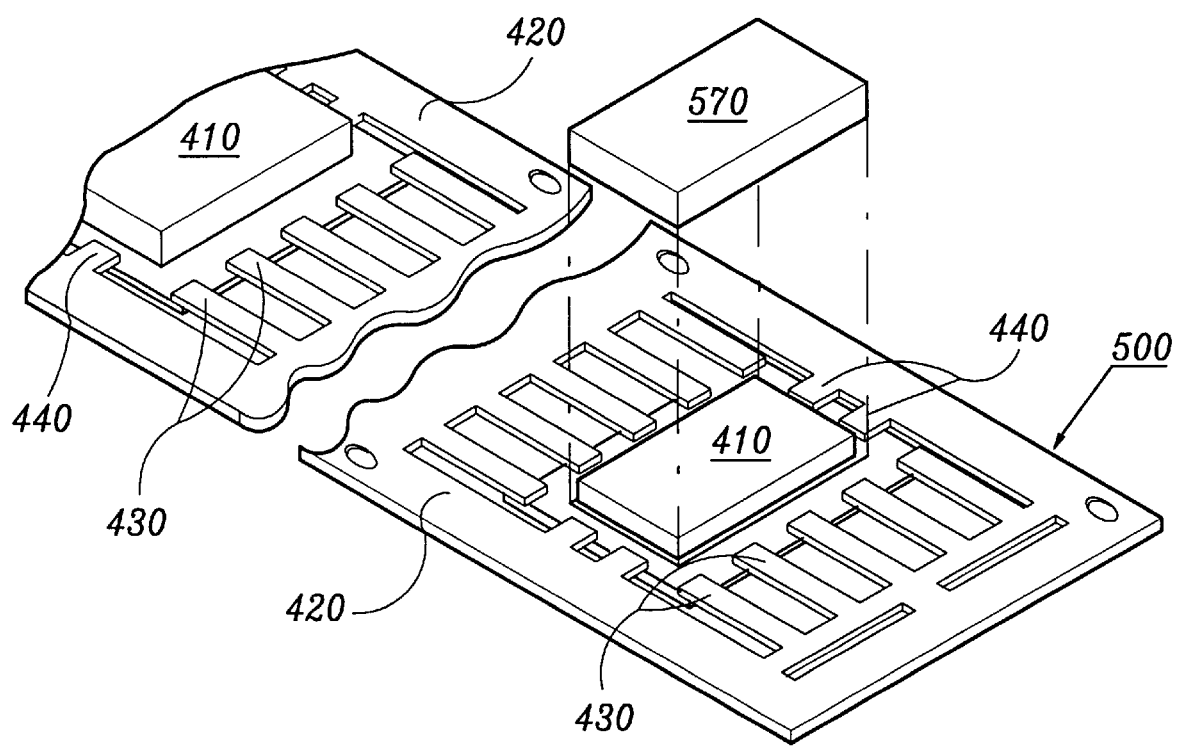
FIG. 20 is a perspective view depicting the encapsulated package in FIG. 19.

FIG. 19 is a perspective view of the bottom of of the device of FIG. 18A, showing the underfilling of the electrical connections in FIG. 18A, and FIG. 20 is a perspective view depicting an encapsulated package of FIG. 19. With reference to FIGS. 19 and 20, the electrical connections are encapsulated by filling the elongated slots 514 with a liquid resin 560. Further, the top surface of base tapes 512 and chips 410 are encapsulated with epoxy molding resin to produce individual chip packages 570. The order of liquid resin and epoxy molding encapsulation steps may be exchanged, or both steps may be carried out simultaneously.

Figure 21:
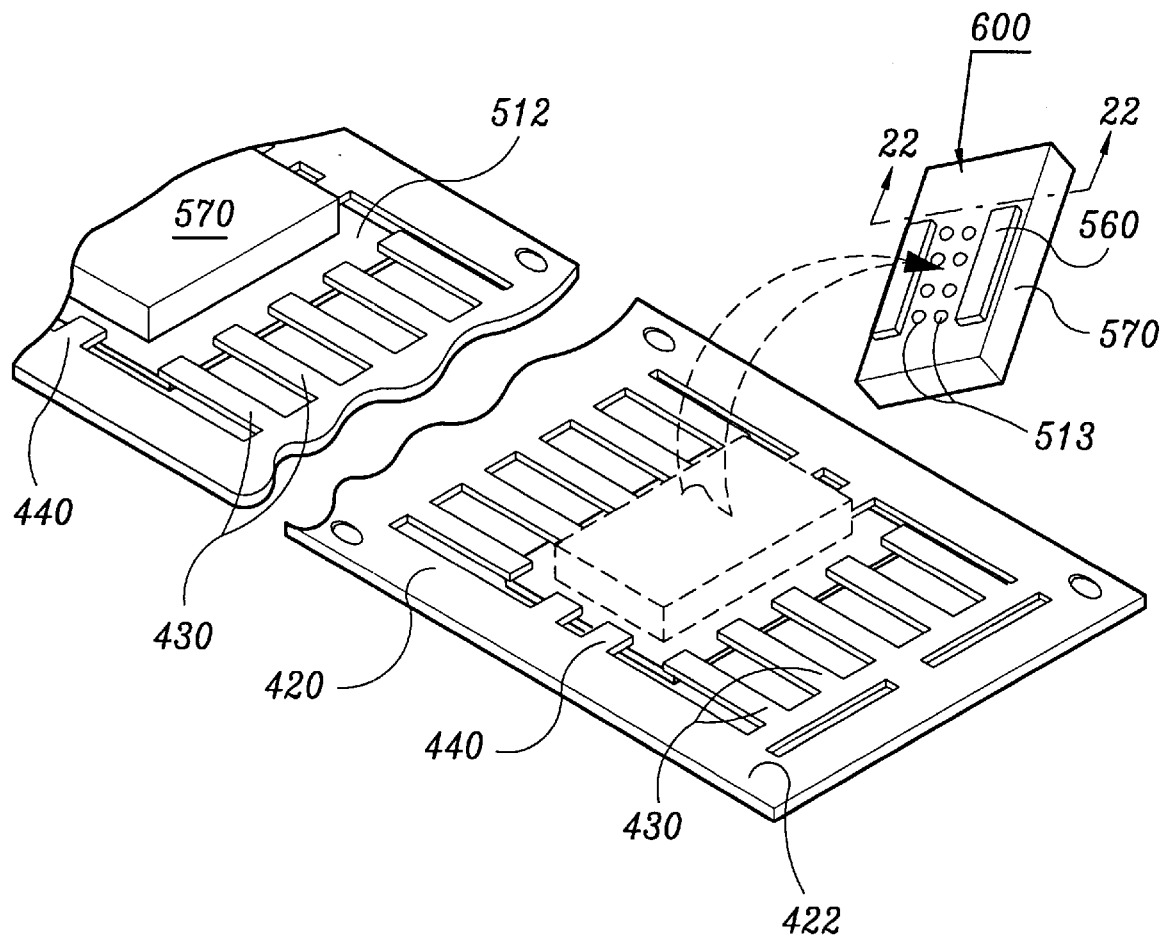
FIG. 21 is a perspective view illustrating the separation of an individual chip from the lead frame strip.
Figure 22:
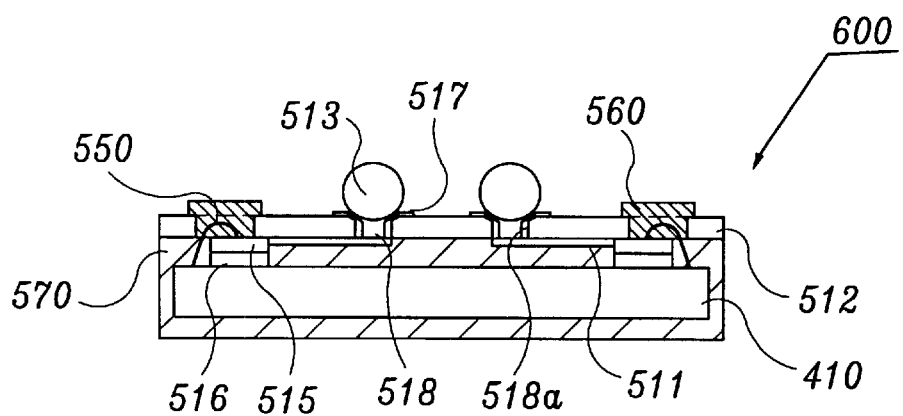
FIG. 22 is a sectional view of the individual chip, taken along the line 22—22 in FIG. 21.

FIG. 21 is a perspective view illustrating the separation of an individual package chip 600 from the lead frame strip 500 and FIG. 22 is a sectional view of the individual chip 600, taken along the line 22—22 in FIG. 21. The individual packages 600 are separated from the lead frame strip 500 by cutting the base tapes 512, that are joined to lead frame strip 500, around the area forming package body 570, using a cutting means such as a punch to produce the individual packages 600. The individual packages 600 are then subjected to various reliability tests prior to shipment.

A cross section of the CSP 600 according to the present invention is shown in FIG. 22. In the orientation shown, the active surface of chip 410 is bonded to the lower surface of adhesive polyimide tapes 516. Bonding pads 448 formed on the side portions of chip 410 are electrically connected to respective of corresponding contact leads 515 via wires 550. The contact leads 515 are again electrically connected to respective of corresponding via holes 518 through circuit patterns 511. The via holes 518 are electrically connected to respective of corresponding external connection terminals 513. Solder pastes 517 may be applied on the upper surface of the base tape 512 around the via holes 518 to easily and securely mount connection terminals 513. The inner walls of via holes 518 are covered with a conductive coating material 518a for electrical connections. Note that the bonding pads 448 of chip 410, contact leads 515, circuit patterns 511, via holes 518 and external connection terminals 513 are thus electrically interconnected.

To protect the chip from the external environment a liquid resin 560 is applied to the elongated slots 514 to protect the electrical connections as shown in FIG. 22. The height of molded part 560 should be lower than that of external contact terminal 513. If the height of the molding part 560 is greater than that of external contact terminals 513, mount failures may occur and electrical connections may be damaged by the external pressure on the molding part 560 when the package 600 is mounted on electrical devices such as a printed circuit board. In a final step, the chips 410 and the lower surface of base tapes 512 are encapsulated with an epoxy resin to produce an individual package.

For the embodiments of the present invention, the external contact terminals may be formed at any stage during the manufacturing process of the present invention. It is preferable, however, to form the terminals on the TAB tape that is formed during the initial step of the process of the present invention.

The specific number of the bonding pads on the chips, of contact leads, and of via holes are not limited to that shown in the embodiments of the present invention, but may be any number required to perform the specific task. Moreover, the electrical connections between the chip and the contact leads of the TAB tape are not limited to the wire bonding method, but may be carried out by using solder bumps as with conventional TABs.

According to the present invention, therefore, it is possible to simultaneously mass produce a plurality of CSPs using a lead frame strip and existing production equipment, thereby reducing production costs.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for manufacturing chip-scale packages using a plurality of tape automated bonding strips and a lead frame strip having a plurality of open central spaces, the method comprising steps of:

bonding a bottom surface of the lead frame strip to top surfaces of the plurality of tape automated bonding tapes in such a manner that a portion of each of the plurality of tape automated bonding tapes is placed adjacent to one of the plurality of open central spaces;

attaching one of a plurality of chips to each of the top surfaces of the plurality of tape automated bonding tapes in the open central spaces of the lead frame strip;

electrically connecting respective chips to contact leads formed on respective tape automated bonding tapes;

encapsulating exposed portions of the plurality of chips, the contact leads, and a portions of the plurality of tape automated bonding tapes with a molding resin to form individual packages; and separating the individual packages from the lead frame strip.

2. A method for manufacturing a chip-scale package, as recited in claim 1, further comprising the steps of aligning respective tape automated bonding tapes below respective open central spaces in the lead frame strip, prior to the bonding step.

3. A method for manufacturing a chip-scale package, as recited in claim 1, wherein, in the bonding step, an outer periphery of each of the tape automated bonding tapes is bonded to a plurality of lead frames extending from the lead frame strip into each of the plurality of open central spaces.

4. A method for manufacturing a chip-scale package, as recited in claim 3, wherein, in the bounding step, the outer periphery of respective tape automated bonding tapes is bonded simultaneously to respective lead frames extending from the lead frame strip into each of the plurality of open central spaces.

5. A method for manufacturing a chip-scale package, as recited in claim 3, wherein, in the bonding step, an outer periphery of each of the tape automated bonding tapes is also bonded to a plurality of tie bars extending from the lead frame strip into each of the plurality of open central spaces.

6. A method for manufacturing a chip-scale package, as recited in claim 5, wherein, in the bonding step, the outer periphery of respective tape automated bonding tapes is bonded simultaneously to respective lead frames and tie bars extending from the lead frame strip into each of the plurality of open central spaces.

7. A method for manufacturing a chip-scale package, as recited in claim 1, wherein the encapsulating step further comprises the substeps of:

encapsulating the top surfaces of the tape automated bonding tapes and the chips; and encapsulating the electrical connections between the chips and the contact leads.

8. A method for manufacturing a chip-scale package, as recited in claim 7, wherein the substeps of encapsulating the top surfaces of the tape automated bonding tapes and the chips is performed before the step of encapsulating the electrical connections between the chips and the contact leads.

9. A method for manufacturing a chip-scale package, as recited in claim 7, wherein the substeps of encapsulating the top surfaces of the tape automated bonding tapes and the chips is performed after the step of encapsulating the electrical connections between the chips and the contact leads.

10. A method for manufacturing a chip-scale package, as recited in claim 7, wherein the substeps of encapsulating the top surfaces of the tape automated bonding tapes and the chips is performed simultaneously with the step of encapsulating the electrical connections between the chips and the contact leads.

* * * * *